(12) United States Patent
Sakurai et al.

(10) Patent No.: US 11,977,009 B2
(45) Date of Patent: May 7, 2024

(54) ANALYSIS DEVICE, ANALYSIS METHOD, AND STORAGE MEDIUM

(71) Applicant: HONDA MOTOR CO., LTD., Tokyo (JP)

(72) Inventors: Atsushi Sakurai, Wako (JP); Hideki Sakai, Wako (JP); Tatsuya Hattori, Wako (JP); Yuji Isogai, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 17/895,097

(22) Filed: Aug. 25, 2022

(65) Prior Publication Data

US 2023/0067374 A1 Mar. 2, 2023

(30) Foreign Application Priority Data

Aug. 30, 2021 (JP) ................. 2021-140098

(51) Int. Cl.
*G01N 1/32* (2006.01)
*H01J 37/20* (2006.01)
*H01J 37/305* (2006.01)

(52) U.S. Cl.
CPC ........... *G01N 1/32* (2013.01); *H01J 37/20* (2013.01); *H01J 37/3056* (2013.01); *H01J 2237/31745* (2013.01)

(58) Field of Classification Search
CPC ........ G01N 1/32; H01J 37/20; H01J 37/3056; H01J 2237/31745
See application file for complete search history.

(56) References Cited

U.S. PATENT DOCUMENTS

| 2014/0136132 A1 | 5/2014 | Maekawa et al. |
| 2020/0218054 A1 | 7/2020 | Sase et al. |
| 2021/0234207 A1* | 7/2021 | Chae ............... H01M 10/48 |
| 2021/0305576 A1 | 9/2021 | Konishi et al. |

FOREIGN PATENT DOCUMENTS

| JP | 2007-123207 | 5/2007 |
| JP | 2014-082021 | 5/2014 |
| JP | 2014-099330 | 5/2014 |
| JP | 2015-099762 | 5/2015 |
| JP | 2017-168378 | 9/2017 |
| JP | 2017-224405 | 12/2017 |
| WO | 2018/131172 | 7/2018 |
| WO | 2020/054615 | 3/2020 |

OTHER PUBLICATIONS

Japanese Office Action for Japanese Patent Application No. 2021-140098 dated Mar. 14, 2023.
Japanese Notice of Allowance for Japanese Patent Application No. 2021-140098 dated Jul. 18, 2023.

\* cited by examiner

*Primary Examiner* — Kevin K Pyo
(74) *Attorney, Agent, or Firm* — Amin, Turocy & Watson, LLP

(57) ABSTRACT

An analysis device of an embodiment is an analysis device of an active material layer of an electrode of a secondary battery, and includes a processor configured to execute a program to acquire image data that represents active materials in the active material layer processed by ion milling and voids or fillings between the active materials by a difference in brightness, and compare patterns of the difference in brightness between the image data in at least two different states of the active material layer.

10 Claims, 6 Drawing Sheets

ANALYSIS DEVICE, ANALYSIS METHOD, AND STORAGE MEDIUM

CROSS-REFERENCE TO RELATED APPLICATION

Priority is claimed on Japanese Patent Application No. 2021-140098, filed Aug. 30, 2021, the content of which is incorporated herein by reference.

BACKGROUND OF THE INVENTION

Field of the Invention

The present invention relates to an analysis device, an analysis method, and a storage medium.

Description of Related Art

Research has been conducted on methods for analyzing various states of a battery. For example, a method of estimating a charging state or a deterioration state of a battery on the basis of an image of a positive electrode active material of an electrode captured by a camera is known (for example, refer to Japanese Unexamined Patent Application, First Publication No. 2017-224405).

On the other hand, a digital image correlation (DIC) is known as a general method for measuring strain and displacement of various materials. In this DIC, spray application is performed on a surface of a material to be analyzed to generate a random pattern and this random pattern is photographed using a camera to perform image analysis, and thereby it is possible to measure the strain and displacement of the material.

SUMMARY OF THE INVENTION

When the conventional DIC is applied as a method for analyzing a state of an electrode provided in a battery, since a thickness of an electrode in a lithium-ion battery is as small as about several tens of μm to several hundreds of μm, and, furthermore in a liquid lithium-ion battery, there are voids on a cross section of an electrode to be analyzed and electrolyte is further infiltrated, it is difficult to form a random pattern on the cross section of the electrode by spray application. For this reason, it has not been easy to apply the conventional DIC to an analysis of electrodes provided in the battery.

The present invention has been made in consideration of such circumstances, and an object of the present invention is to provide an analysis device, an analysis method, and a storage medium capable of analyzing a state of an electrode provided in a battery with high accuracy.

An analysis device, an analysis method, and a storage medium according to the present invention have adopted the following configuration.

(1) An analysis device according to one aspect of the present invention is an analysis device of an active material layer of an electrode of a secondary battery, and includes a processor configured to execute a program to acquire image data that represents active materials in the active material layer processed by ion milling and voids or fillings between the active materials by a difference in brightness, and compare patterns of the difference in brightness between the image data in at least two different states of the active material layer.

In an aspect of (2), in the analysis device according to the aspect of (1) described above, the processor may execute the program to calculate at least one of a displacement amount of the active material, a change amount of a layer thickness of the active material layer, a strain distribution in the active material layer, and a displacement distribution of the active material in the active material layer on the basis of a result of comparing the patterns of the difference in brightness between the image data.

In an aspect of (3), in the analysis device according to the aspect of (1) or (2) described above, the processor may execute the program to acquire the image data captured by a scanning electron microscope.

In an aspect of (4), in the analysis device according to the aspect of (1) or (2) described above, the processor may execute the program to acquire the image data, which is a color image captured by a confocal microscope, and convert the image data into grayscale.

In an aspect of (5), in the analysis device according to the aspect of (1) or (2) described above, the processor may execute the program to acquire the image data, which is a color image captured by a confocal microscope, and adjust any one of a hue, lightness, and saturation of the image data according to a charging state of the secondary battery when the image data is acquired.

(6) An analysis method according to another aspect of the present invention is an analysis method of an active material layer of an electrode of a secondary battery, and includes, by a computer, acquiring first image data that represents active materials in the active material layer and voids or fillings between the active materials by a difference in brightness in a first state of the active material layer processed by ion milling, acquiring second image data that represents the active materials in the active material layer and voids or fillings between the active materials by a difference in brightness in a second state different from the first state of the processed active material layer, and comparing patterns of the difference in brightness between the first image data and the second image data.

In an aspect of (7), the analysis method according to the aspect of (6) described above further includes calculating at least one of a displacement amount of the active material, a change amount of a layer thickness of the active material layer, a strain distribution in the active material layer, and a displacement distribution of the active material in the active material layer on the basis of a result of comparing the patterns of the difference in brightness between the first image data and the second image data.

In an aspect of (8), in the analysis method according to the aspect of (6) or (7) described above, the first image data and the second image data captured by a scanning electron microscope are acquired.

In an aspect of (9), in the analysis method according to the aspect of (6) or (7) described above, the first image data and the second image data, which are color images captured by a confocal microscope, are acquired, and the analysis method further includes converting the first image data and the second image data into grayscale.

In an aspect of (10), in the analysis method according to the aspect of (6) or (7) described above, the first image data and the second image data, which are color images captured by the confocal microscope, are acquired, and the analysis method further includes adjusting any one of a hue, lightness, and saturation of the first image data and the second image data according to a charging state of the secondary battery when the first image data and the second image data are acquired.

In an aspect of (11), the analysis method according to any one of the aspects of (6) to (10) described above further includes processing the active material layer by ion milling.

(12) A non-transitory computer-readable storage medium according to still another aspect of the present invention stores a program that analyzes an active material layer of an electrode of a secondary battery, and causes a computer to execute acquiring first image data that represents active materials in the active material layer and voids or fillings between the active materials by a difference in brightness in a first state of the active material layer processed by ion milling, acquiring second image data that represents the active materials in the active material layer and voids or fillings between the active materials by a difference in brightness in a second state different from the first state of the processed active material layer, and comparing patterns of the difference in brightness between the first image data and the second image data.

According to the aspects of (1) to (12) described above, it is possible to analyze a state of an electrode provided in a battery with high accuracy. By using image data that represents active materials in an active material layer and voids or fillings between active materials by a difference in brightness, DIC such as the conventional DIC can be applied to a cross section of an electrode where it is difficult to form a random pattern by spray application.

According to the aspects of (4), (5), (9), and (10), DIC using image data captured by a confocal microscope, which is cheaper than a scanning electron microscope, can be used. Since it is not necessary to keep an electrode to be analyzed under a vacuum condition at the time of capturing an image, unlike the scanning electron microscope, the confocal microscope can also be applied to a secondary battery of a liquid system. In addition, it is possible to reduce a recognition error in the DIC by canceling an influence of a color change according to a charging state of a negative electrode or the like.

DETAILED DESCRIPTION OF THE INVENTION

Hereinafter, embodiments of an analysis device, an analysis method, and a storage medium of the present invention will be described with reference to the drawings.

[Overall Configuration]

Figure 1:
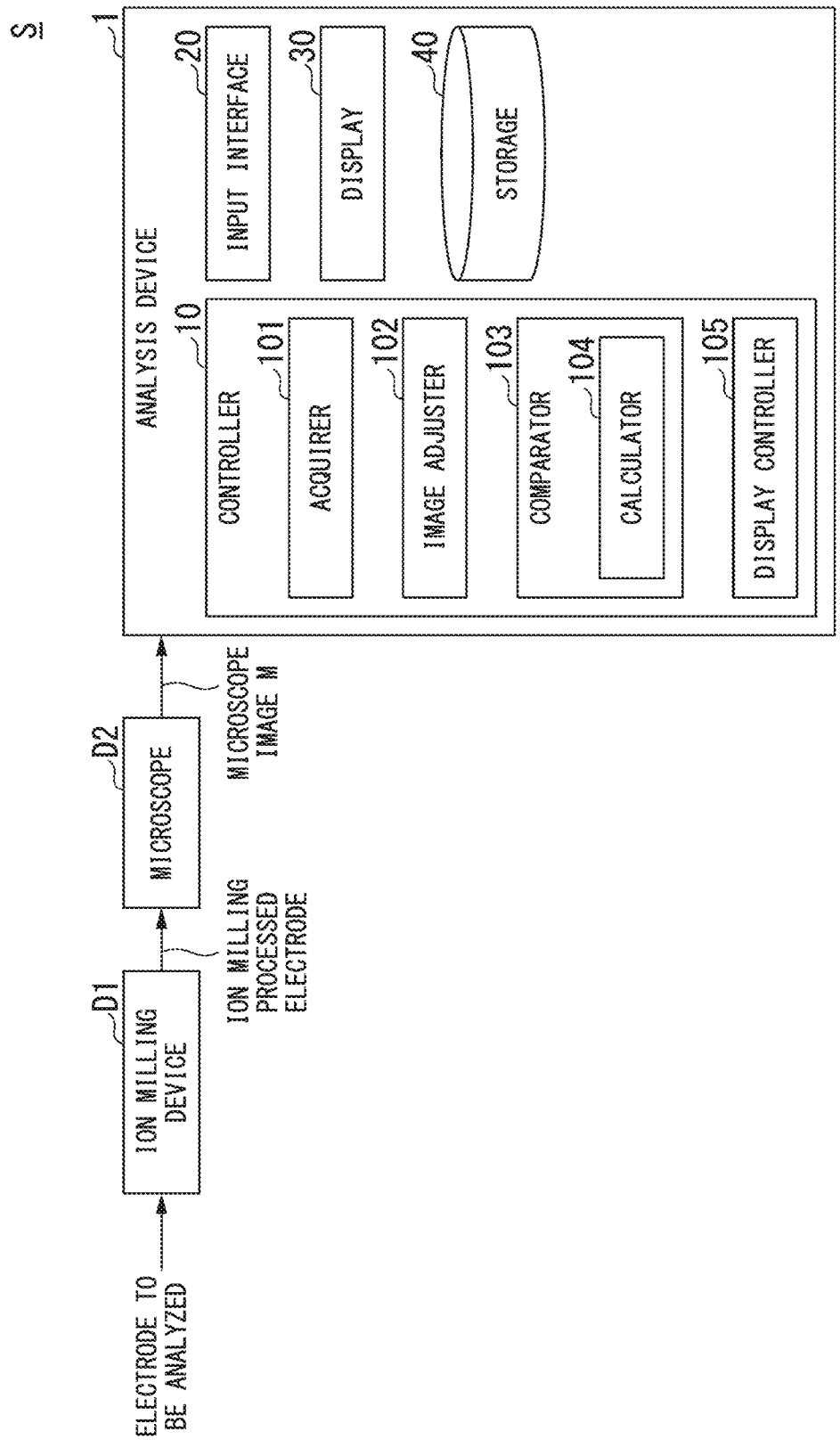
FIG. 1 is a diagram which shows an example of a configuration of an analysis system including an analysis device according to an embodiment.

FIG. 1 is a diagram which shows an example of a configuration of an analysis system S including an analysis device 1 according to an embodiment. The analysis system S performs analysis processing of a state of an electrode (a positive electrode, a negative electrode) provided in a secondary battery. The analysis system S is provided in, for example, a facility for researching and developing secondary batteries. The analysis system S includes, for example, an ion milling device D1, a microscope D2, and the analysis device 1.

The ion milling device D1 performs an ion milling process on an electrode to be analyzed. The ion milling device D1 performs the ion milling process by, for example, irradiating a surface of the electrode with an argon ion beam to polish or etch the surface of the electrode.

The microscope D2 captures a cross-sectional image of an active material layer of an electrode subjected to the ion milling process performed by the ion milling device D1. The microscope D2 is, for example, a confocal microscope (a confocal laser microscope, a confocal microscope) or a scanning electron microscope (SEM). The microscope D2 captures the cross-sectional image of the active material layer of the ion milling processed electrode in a plurality of states. For example, the microscope D2 acquires first image data of the active material layer of the ion milling processed electrode in a first state and second image data of the active material layer of the ion milling processed electrode in a second state different from the first state. The first state and the second state are, for example, states in which charging states of a battery are different from each other. For example, the first state and the second state are states in which charge rates (SOCs: state of charge) of the battery are different from each other. Alternatively, the first state and the second state are, for example, states in which load conditions of an electrode are different from each other. For example, the first state and the second state are states in which loads applied to the electrode are different from each other when the electrode is fixed in the battery.

The analysis device 1 analyzes a state (a structural behavior) of the electrode to be analyzed on the basis of the microscope image M captured by the microscope D2. The analysis device 1 substitutes a light and dark pattern between an active material and voids between the active materials or fillings between the active materials in the microscope image M of a cross section of the ion milling processed electrode for a random pattern generated by spray application in a conventional DIC, thereby acquiring a strain in the cross section of the electrode by the DIC or a displacement distribution.

[Analysis Device]

The analysis device 1 includes, for example, a controller 10, an input interface 20, a display 30, and a storage 40.

The controller 10 controls an overall operation of the analysis device 1. The controller 10 includes, for example, an acquirer 101, an image adjuster 102, a comparator 103, a calculator 104, and a display controller 105. Each functional unit of the controller 10 is realized by a hardware processor (computer) such as a central processing unit (CPU) executing a program (software). In addition, each functional part may be realized by hardware (a circuit unit; including circuitry) such as large scale integration (LSI), an application specific integrated circuit (ASIC), a field-programmable gate array (FPGA), or a graphics processing unit (GPU), or may be realized by software and hardware in cooperation. The program may be stored in a storage 40 (a storage device having a non-transitory storage medium) in advance, or may be stored in a detachable storage medium such as a DVD or a CD-ROM and installed in the storage 40 by the storage medium (the non-transitory storage medium) being attached to a drive device.

The acquirer 101 acquires the microscope image M captured by the microscope D2. When the analysis device 1 and the microscope D2 are communicably connected via a network, the acquirer 101 acquires the microscope image M from the microscope D2 via this network. Alternatively, the acquirer 101 may acquire the microscope image M from a portable storage medium that has stored the microscope image M via an input interface 20 on the basis of an operation of an operator.

The acquirer 101 acquires a cross-sectional image of the active material layer of the ion milling processed electrode in a plurality of states. The acquirer 101 acquires, for example, the first image data of the ion milling processed electrode in the first state and the second image data of the ion milling processed electrode in the second state. That is, the acquirer 101 acquires image data which represents the active material in the active material layer processed by ion milling and the voids or fillings between the active materials by a difference in brightness.

The image adjuster 102 performs processing of converting the microscope image M, which is a color image captured by the confocal microscope, into grayscale. In addition, the image adjuster 102 performs color adjustment processing in which the charging state of a battery is reflected in the microscope image M, which is a color image captured by the confocal microscope. Details of the processing of the image adjuster 102 will be described below. By performing such image adjustment, it is possible to cancel an influence of a color change according to the charging state of a negative electrode or the like even when the color image is used, and to reduce a recognition error in the DIC to be described below.

The comparator 103 compares the first image data with the second image data. The comparator 103 compares a pattern (a digital pattern) of a difference in brightness of the first image data with a pattern (a digital pattern) of a difference in brightness of the second image data, and outputs a result of the comparison. The comparator 103 compares, for example, the pattern of the difference in brightness of the first image data and the pattern of the difference in brightness of the second image data using the DIC. That is, comparator 103 compares the patterns of the difference in brightness between image data in at least two different states of the active material layer. Details of the processing of the comparator 103 will be described below.

The calculator 104 calculates a displacement amount of an active material included in the active material layer of the ion milling processed electrode and a change amount of a layer thickness of the active material layer on the basis of the result of the comparison of the DIC. In addition, the calculator 104 calculates a strain distribution in the active material layer, a displacement distribution of the active material in the active material layer, a stress distribution, and the like on the basis of the calculated displacement amount of the active material, the change amount of the layer thickness of the active material layer, and the like. That is, the calculator 104 calculates at least one of the displacement amount of the active material, the change amount of the layer thickness of the active material layer, a strain distribution in the active material layer, and a displacement distribution of the active material in the active material layer on the basis of a result of the comparison in the pattern of the difference in brightness between the image data. Details of the processing of the calculator 104 will be described below.

The display controller 105 controls display content to be displayed on the display 30. The display controller 105 causes an image to be displayed on the display 30, which shows, for example, the displacement amount of the active material, the change amount of the layer thickness of the active material layer, the strain distribution in the active material layer, the displacement distribution of the active material in the active material layer, the stress distribution in the active material layer, and the like, which are calculated by the calculator 104.

The input interface 20 receives various input operations from the operator of the analysis device 1, and converts the received input operations into electric signals to output them to the controller 10. For example, the input interface 20 includes a mouse, a keyboard, a touch panel, and the like. When the input interface 20 is a touch panel, the input interface 20 may also have a display function of the display 30. Moreover, the input interface 20 may include a device to which a portable storage medium such as a Universal Serial Bus (USB) memory can be connected and which can read data (the microscope image M, and the like) stored in this portable storage medium.

The display 30 displays various types of information. The display 30 displays, for example, an image that shows a result of the analysis generated by the controller 10, a graphical user interface (GUI) for receiving various input operations from the operator, and the like. The display 30 is, for example, a display, a touch panel, or the like.

The storage 40 stores the microscope image M and the like acquired by the acquirer 101. The storage 40 is, for example, a hard disk drive (HDD), a flash memory, a random access memory (RAM), or the like.

[Processing Flow]

Figure 2:
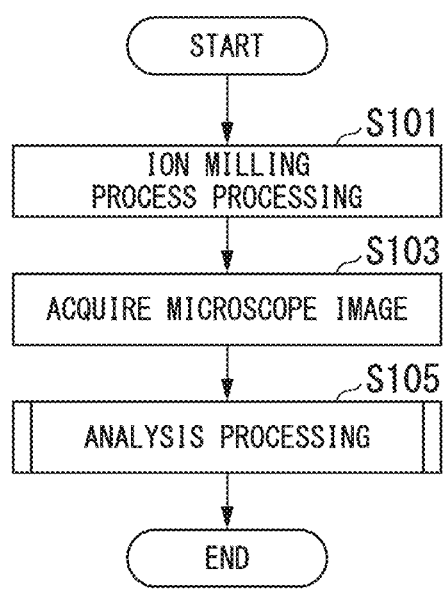
FIG. 2 is a flowchart which shows an example of a flow of processing of the analysis system according to the embodiment.

Next, a processing flow of the analysis system S will be described. A case where the electrode to be analyzed is an electrode of a lithium-ion battery and the microscope D2 is a confocal microscope will be described below as an example. FIG. 2 is a flowchart which shows an example of the processing flow of the analysis system S according to the embodiment. First, ion milling is performed on the electrode to be analyzed by the ion milling device D1 (step S101).

Next, the microscope image M of the cross section of the active material layer of the ion milling processed electrode is acquired using the microscope D2 (step S103). Using the microscope D2, for example, a microscope image (the first image data) of the active material layer of the ion milling processed electrode in the first state and a microscope image (the second image data) of the active material layer of the ion milling processed electrode in the second state are acquired.

Figure 4:
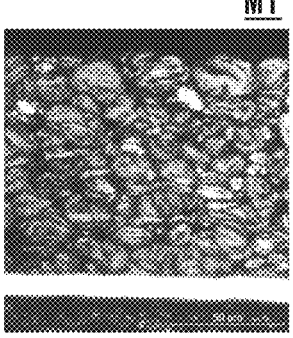
FIG. 4 is a diagram which shows an example of a microscope image of a negative electrode captured under conditions in which charging states are different from each other according to the embodiment.

FIG. 4 is a diagram which shows an example of the microscope image M of a negative electrode captured under conditions in which the charging states are different from each other according to the embodiment. A microscope image M1 is an image of the negative electrode (graphite) captured in the first state where the SOC is 40%, and a microscope image M2 is an image of the same negative electrode captured in the second state where the SOC is 90%. The microscope image M1 and the microscope image M2 are color images captured by a confocal microscope. As shown in FIG. 4, as a filling rate increases (that is, a Li ion content rate increases), a color of the active material in the image changes.

Next, the analysis device 1 performs analysis processing of the microscope image M captured by the microscope D2

Figure 3:
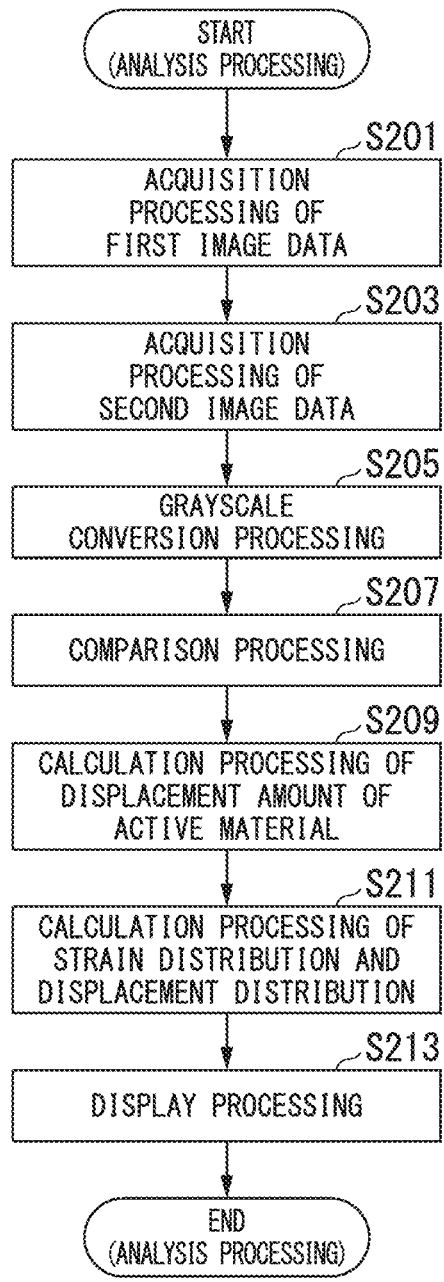
FIG. 3 is a flowchart which shows an example of a flow of analysis processing of the analysis device according to the embodiment.

(step S105). FIG. 3 is a flowchart which shows an example of a flow of the analysis processing of the analysis device 1 according to the embodiment.

First, the acquirer 101 of the controller 10 acquires the microscope image M1 (the first image data) (step S201) and acquires the microscope image M2 (the second image data) (step S203). When the analysis device 1 and the microscope D2 are communicably connected via a network, the acquirer 101 acquires the microscope image M from the microscope D2 via this network. Alternatively, the acquirer 101 may acquire the microscope image M from the portable storage medium that has stored the microscope image M via the input interface 20 on the basis of the operation of the operator.

Next, the image adjuster 102 of the controller 10 performs processing of converting each of the microscope image M1 and the microscope image M2, which are color images, into grayscale (step S205). In the grayscale conversion processing, for example, a grayscale value is determined for each pixel of a microscope image on the basis of the RGB values. For example, a grayscale value Y is determined according to the following equation (1) or equation (2). In addition, another grayscale conversion method may also be used for the grayscale conversion processing.

$$Y=(\text{Maximum value of } RGB+\text{minimum value of } RGB)/2 \quad \text{Equation (1)}$$

$$Y=0.299 \times R+0.587 \times G+0.114 \times B \quad \text{Equation (2)}$$

A grayscale image M_g1 shown in FIG. 4 is a grayscale image of the microscope image M1, and a grayscale image M_g2 is a grayscale image of the microscope image M2. In the grayscale image M_g1 and the grayscale image M_g2, an active material and voids between active materials are represented by the difference in brightness.

When an electrode of an all-solid-state lithium-ion battery is to be analyzed, and the like, the grayscale image represents active materials and fillings (SE: solid electrolyte) between the active materials by the difference in brightness. In addition, when the microscope image is a black-and-white image captured by a scanning electron microscope, the grayscale conversion processing described above may be omitted.

Next, the comparator 103 of the controller 10 performs comparison processing using DIC using the grayscale image M_g1 and the grayscale image M_g2 (step S207). In the comparison processing, one image set as a reference is divided into small regions (reference images) referred to as subsets, an image analysis is used to determine in which region of the other image each subset is positioned, and thereby a displacement amount of a subset is calculated. For example, a correlation value between each subset defined in one image and each region (pixel group) in the other image is calculated, and a correspondence and a displacement amount of positions of a subset between the two images are calculated on the basis of the calculated correlation value. The correlation value is calculated on the basis of, for example, a brightness value of each pixel included in the subset.

Next, the calculator 104 of the controller 10 calculates the displacement amount of the active material on the basis of a result of the comparison by the comparator 103 (step S209). Moreover, the calculator 104 calculates the strain distribution and the displacement distribution of the active material in the active material layer on the basis of the result of the comparison by the comparator 103 (step S211). Next, the display controller 105 of the controller 10 causes the display 30 to display a page that shows a result of the analysis (step S213).

Figure 5:
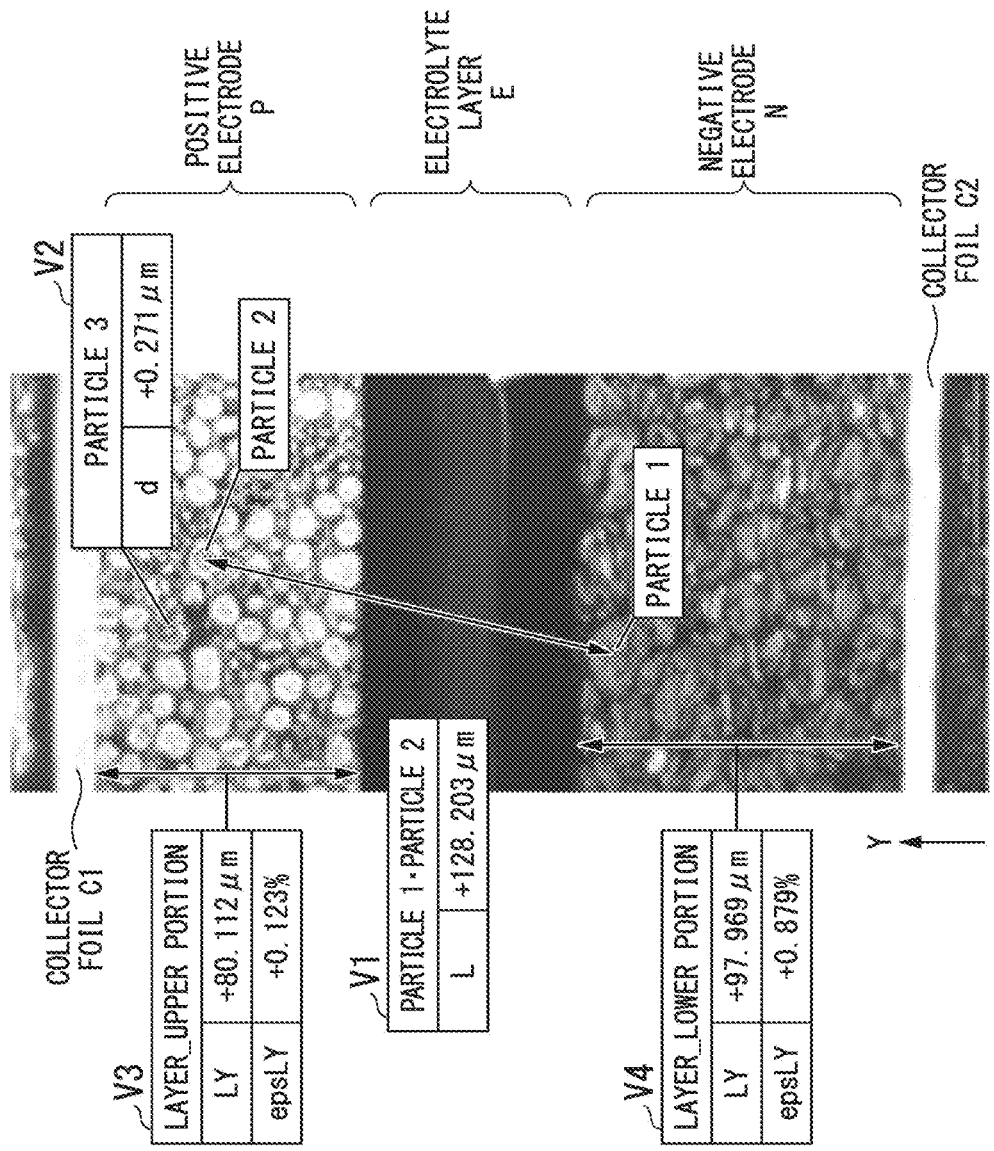
FIG. 5 is a diagram which shows an analysis result page showing an example of an analysis result displayed on a display according to the embodiment.

FIG. 5 is a diagram which shows an analysis result page P1 showing an example of the result of the analysis displayed on the display 30 according to the embodiment. The analysis result page P1 is obtained by adding information on the result of the analysis to the grayscale image M_g1 captured in the first state (SOC 40%). In the analysis result page P1, the displacement amount of the active material when the grayscale image M_g2 captured in the second state (SOC 90%), which is set as a reference, is changed from the second state to the first state is shown. The analysis result page P1 shows a battery structure including a current collector foil C1, a positive electrode P (a ternary positive electrode material), an electrolyte layer E, a negative electrode N (graphite), and a current collector foil C2.

In a display field V2 of the analysis result page P1 shown in FIG. 5, it is shown that a position of one active material (a particle 3) in the positive electrode P in the grayscale image M_g1 (the first state) is changed by the displacement amount d=0.271 μm as compared with the grayscale image M_g2 (the second state). In addition, in a display field V1, it is shown that a distance between one active material (a particle 2) in the positive electrode P and one active material (a particle 1) in the negative electrode N in the grayscale image M_g1 (the first state) is changed by a change amount L=128.203 μm as compared with the grayscale image M_g2 (the second state). Moreover, in a display column V3, it is shown that a layer thickness of the positive electrode P in a Y direction in the grayscale image M_g1 (the first state) is LY=80.112 μm, and is changed by a change rate epsLY=+0.123% as compared with the grayscale image M_g2 (the second state). Moreover, in a display column V4, it is shown that a layer thickness of the negative electrode N in the Y direction in the grayscale image M_g1 (the first state) is LY=97.969 μm, and is changed by the change rate epsLY=+0.879% as compared with the grayscale image M_g2 (the second state). It should be noted that an active material of which the displacement amount or the like is displayed may be designated in the analysis result page P1 on the basis of an instruction of the operator via the input interface 20.

Figure 6:
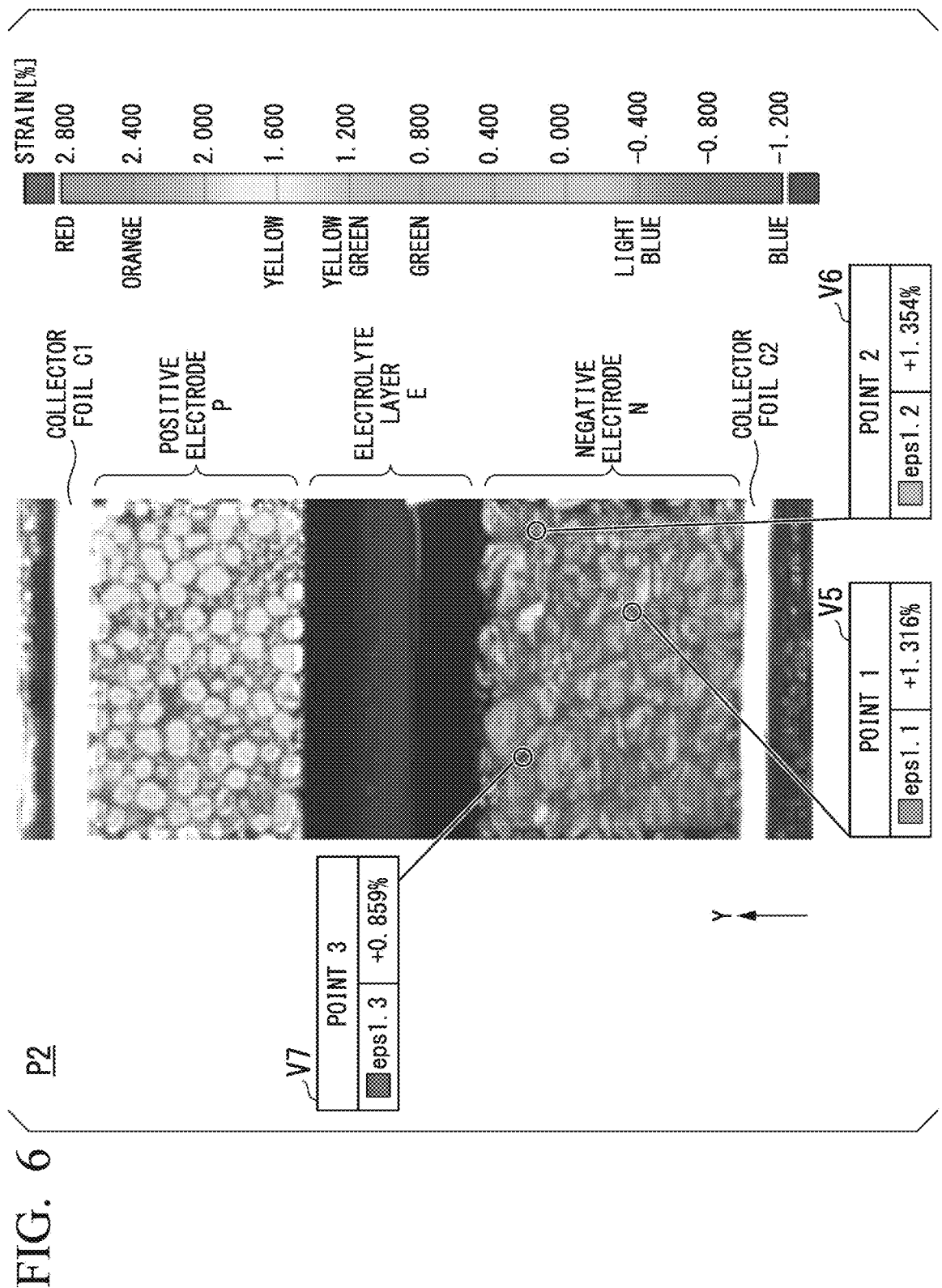
FIG. 6 is a diagram which shows an analysis result page showing another example of the analysis result displayed on the display according to the embodiment.

FIG. 6 is a diagram which shows an analysis result page P2 showing another example of the result of the analysis displayed on the display 30 according to the embodiment. The analysis result page P2 corresponds to the analysis result page P1 shown in FIG. 5 and shows the strain distribution in the active material layer. In the example shown in FIG. 6, the strain distribution of each region of the electrode, superimposed on the grayscale image M_g1, is represented by a color of a gradation associated with a value of strain [%]. In a display field V5 of the analysis result page P2, it is shown that the strain value at a point 1 of the negative electrode N is eps1.1=1.316%. In addition, in a display column V6, it is shown that the strain value at a point 2 of the negative electrode N is eps1.2=1.354%. Moreover, in a display column V7, it is shown that the strain value at a point 3 of the negative electrode N is eps1.3=0.859%. It should be noted that a place where the strain value is displayed may be designated in the analysis result page P2 on the basis of the instruction of the operator via the input interface 20. Moreover, in the analysis result page P2, a direction of strain between any two points may be displayed. Furthermore, it may be possible to display information on a stress distribution, a stress direction, and the like on the basis of information on the strain distribution and the strain direction.

By causing the display 30 to display the analysis result page as described above, the operator can check the displacement amount of the active material, the change amount of the layer thickness of the active material layer, the strain distribution in the active material layer, the displacement distribution of the active material in the active material layer, and the like. As a result, processing in the flowchart shown in FIGS. 2 and 3 is completed.

Modified Example

In the embodiment described above, a configuration in which the grayscale conversion processing is performed on the microscope image M, which is a color image acquired by the confocal microscope, has been described, but the color adjustment processing in which the charging state of a battery is reflected may also be performed in place of or in addition to the grayscale conversion processing. That is, the image adjuster 102 of the controller 10 adjusts any one of a hue, lightness, and saturation of image data according to the charging state of a secondary battery when the image data is acquired. For example, the image adjuster 102 performs color adjustment in which the charging state (SOC) is reflected in each of the microscope image M1 and the microscope image M2, which are color images according to the following equation (3).

$$[R',G',B']=[(\alpha \times \Delta SOC+1) \times R, (\beta \times \Delta SOC+1) \times G, (\gamma \times \Delta SOC+1) \times B]$$ Equation (3)

In Equation (3) described above, [R',G',B'] is a color after the adjustment processing, [R,G,B] is a color of the microscope image M which is an original image, $\Delta SOC$ is a fluctuation range of the charging state electrically measured, and $\alpha$, $\beta$, and $\gamma$ are correction coefficients per $\Delta SOC$ and are numerical values set according to the material characteristics. For example, when the microscope image M2 captured in the second state (SOC 90%) is subjected to color adjustment to match the microscope image M1 captured in the first state (SOC 40%), each pixel of the microscope image M2 is adjusted by applying Equation (3) described above such that [R',G',B']=[(−0.68×50 [%]+1)×R, (0.17×50 [%]+1)×G, (1.20×50 [%]+1)×B]. After this color adjustment, the grayscale conversion processing may be further performed.

According to the embodiments described above, by providing the acquirer (101) that acquires image data representing the active material in the active material layer processed by ion milling and the voids or fillings between the active materials by the difference in brightness, and the comparator (103) that compares the patterns of the difference in brightness between image data in at least two different states of the active material layer, it is possible to analyze the state of an electrode provided in a battery with high accuracy. By using image data that represents the active material in the active material layer and the voids or fillings between the active materials by the difference in brightness, it is possible to apply DIC such as the conventional DIC to the cross section of an electrode where it is difficult to form a random pattern by spray application. In addition, the DIC can be used even when image data captured by a confocal microscope, which is an inexpensive device as compared with a scanning electron microscope, is used. Unlike the scanning electron microscope, it is not necessary to keep the electrode to be analyzed under a vacuum condition at the time of capturing an image, so that it can also be applied to a liquid-based secondary battery. Moreover, it is possible to reduce a recognition error in the DIC by canceling the influence of a color change according to a charging state of a negative electrode or the like.

The embodiments described above can be expressed as follows.

An analysis device is an analysis device of an active material layer of an electrode of a secondary battery, and includes a storage device storing a program, and a hardware processor, and the hardware processor executes the program, thereby including an acquirer that acquires image data that represents active materials in the active material layer processed by ion milling and voids or fillings between the active materials by a difference in brightness, and a comparator that compares patterns of the difference in brightness between the image data in at least two different states of the active material layer.

Although modes for implementing the present invention have been described above using the embodiments, the present invention is not limited to these embodiments, and various modifications and substitutions can be made within a range not departing from the gist of the present invention.

What is claimed is:

1. An analysis device of an active material layer of an electrode of a secondary battery, the analysis device comprising a processor configured to execute a program to:
   acquire image data that represents active materials in the active material layer processed by ion milling and voids or fillings between the active materials by a difference in brightness; and
   compare patterns of the difference in brightness between the image data in at least two different states of the active material layer,
   wherein the processor executes the program to:
   acquire the image data, which is a color image captured by a confocal microscope;
   convert the image data into grayscale; and
   compare the patterns of the difference in brightness between the grayscale image data in at least two different states of the active material layer.

2. The analysis device according to claim 1, wherein the processor executes the program to:
   calculate at least one of a displacement amount of the active material, a change amount of a layer thickness of the active material layer, a strain distribution in the active material layer, and a displacement distribution of the active material in the active material layer on the basis of a result of comparing the patterns of the difference in brightness between the image data.

3. The analysis device according to claim 1, wherein the processor executes the program to:
   acquire the image data captured by a scanning electron microscope.

4. The analysis device according to claim 1, wherein the processor executes the program to:
   adjust any one of a hue, lightness, and saturation of the image data according to a charging state of the secondary battery when the image data is acquired.

5. An analysis method of an active material layer of an electrode of a secondary battery, the analysis method comprising;
   by a computer,
   acquiring first image data that represents active materials in the active material layer and voids or fillings between the active materials by a difference in brightness in a first state of the active material layer processed by ion milling;
   acquiring second image data that represents the active materials in the active material layer and voids or fillings between the active materials by a difference in brightness in a second state different from the first state of the processed active material layer; and comparing patterns of the difference in brightness between the first image data and the second image data, wherein the first image data and the second image data are color images captured by a confocal microscope, and the analysis method further comprises:

converting the first image data and the second image data into grayscale; and comparing the patterns of the difference in brightness between the grayscale first image data and the grayscale second image data.

6. The analysis method according to claim 5, further comprising:

calculating at least one of a displacement amount of the active material, a change amount of a layer thickness of the active material layer, a strain distribution in the active material layer, and a displacement distribution of the active material in the active material layer on the basis of a result of comparing the patterns of the difference in brightness between the first image data and the second image data.

7. The analysis method according to claim 5, wherein the first image data and the second image data captured by a scanning electron microscope are acquired.

8. The analysis method according to claim 5, wherein the analysis method further comprises adjusting any one of hue, lightness, and saturation of the first image data and the second image data according to a charging state of the secondary battery when the first image data and the second image data are acquired.

9. The analysis method according to claim 5, further comprising:

processing the active material layer by ion milling.

10. A non-transitory computer-readable storage medium storing a program that analyzes an active material layer of an electrode of a secondary battery, and causes a computer to execute:

acquiring first image data that represents active materials in the active material layer and voids or fillings between the active materials by a difference in brightness in a first state of the active material layer processed by ion milling;

acquiring second image data that represents the active materials in the active material layer and voids or fillings between the active materials by a difference in brightness in a second state different from the first state of the processed active material layer; and comparing patterns of the difference in brightness between the first image data and the second image data, wherein the first image data and the second image data are color images captured by a confocal microscope, and the program further causes the computer to execute:

converting the first image data and the second image data into grayscale; and comparing the patterns of the difference in brightness between the grayscale first image data and the grayscale second image data.

* * * * *